(12) United States Patent
Fan

(10) Patent No.: US 11,985,886 B2
(45) Date of Patent: *May 14, 2024

(54) DISPLAY PANEL AND DISPLAY DEVICE

(71) Applicant: WuHan TianMa Micro-electronics CO.,LTD, Wuhan (CN)

(72) Inventor: Yanyun Fan, Wuhan (CN)

(73) Assignee: WuHan TianMa Micro-electronics CO., LTD, Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/148,919

(22) Filed: Dec. 30, 2022

(65) Prior Publication Data

US 2023/0137810 A1 May 4, 2023

Related U.S. Application Data

(63) Continuation of application No. 16/730,583, filed on Dec. 30, 2019, now Pat. No. 11,574,968.

(30) Foreign Application Priority Data

Aug. 27, 2019 (CN) .......................... 201910795530.2

(51) Int. Cl.
  *G09G 3/3258* (2016.01)
  *G06F 1/16* (2006.01)
  (Continued)

(52) U.S. Cl.
  CPC .......... *H10K 59/65* (2023.02); *G06F 1/1605* (2013.01); *H10K 59/121* (2023.02)

(58) Field of Classification Search
  CPC ............ G09G 5/14; G09G 5/377; G09G 3/20; G09G 3/30; G09G 3/3208; G09G 3/3275;
  (Continued)

(56) References Cited

U.S. PATENT DOCUMENTS

2018/0219058 A1 8/2018 Xiang et al.
2020/0052048 A1 2/2020 Kuo et al.
(Continued)

FOREIGN PATENT DOCUMENTS

| CN | 108520888 A | 9/2018 |
|---|---|---|
| CN | 207947007 U | 10/2018 |
| CN | 109148537 A | 1/2019 |
| CN | 109755282 A | 5/2019 |

OTHER PUBLICATIONS

First Chinese Office Action mailed on Apr. 7, 2021, issued in corresponding Chinese Application No. 201910795530.2, filed on Aug. 27, 2019, and its English translation thereof, 15 pages.

*Primary Examiner* — Chanh D Nguyen
*Assistant Examiner* — Nguyen H Truong
(74) *Attorney, Agent, or Firm* — CHRISTENSON O'CONNOR JOHNSON KINDNESS PLLC

(57) ABSTRACT

Provided is a display panel and a display device, the display has a display area having an optical module arrangement region, a first display area, and a second display area, the display panel includes a plurality of pixels provided in the display area, the pixels include first pixels located in the optical module arrangement region, second pixels located in the first display area, and third pixels in the second display area; and pixel circuits including first pixel circuits, second pixel circuits, and third pixel circuits; the second pixel circuits are located in the first display area and electrically connected to the second pixels, the third pixel circuits are located in the second display area and electrically connected to the third pixels, the first pixel circuits are electrically connected to the first pixels and transistors of at least some of the first pixel circuits are located in the first display area.

10 Claims, 9 Drawing Sheets

(51) Int. Cl.
*H10K 59/121* (2023.01)
*H10K 59/65* (2023.01)

(58) Field of Classification Search
CPC .. G09G 3/3225; G09G 3/3258; G09G 3/3291; G09G 3/3233; G09G 3/3216; H01L 51/00; H01L 51/50; H01L 51/52; H01L 51/56; H01L 27/12; H01L 27/15; H01L 27/32; H01L 33/38; H01L 33/24; H01L 33/40; H01L 33/62; H01L 25/075; H01L 25/18; G06K 9/00; H04N 5/225; H04N 5/232; H04N 9/04; G06F 1/16; G06F 1/18

See application file for complete search history.

(56) References Cited

U.S. PATENT DOCUMENTS

| | | | |
|---|---|---|---|
| 2020/0227488 | A1 | 7/2020 | Xin et al. |
| 2020/0251539 | A1* | 8/2020 | Fu ................. H10K 59/179 |
| 2021/0013277 | A1 | 1/2021 | Liu et al. |
| 2021/0065625 | A1 | 3/2021 | Wang et al. |
| 2021/0217821 | A1 | 7/2021 | Han et al. |
| 2021/0248945 | A1 | 8/2021 | Liu et al. |
| 2021/0272499 | A1 | 9/2021 | Shen et al. |
| 2021/0280128 | A1* | 9/2021 | Shen .................. G09G 3/3225 |
| 2021/0327958 | A1 | 10/2021 | Li et al. |
| 2021/0351255 | A1* | 11/2021 | Chang ............... H10K 59/1213 |
| 2021/0359031 | A1 | 11/2021 | Zheng et al. |
| 2021/0359080 | A1 | 11/2021 | Xu et al. |
| 2021/0408152 | A1 | 12/2021 | Lou et al. |

* cited by examiner

DISPLAY PANEL AND DISPLAY DEVICE

CROSS-REFERENCE TO RELATED APPLICATIONS

This application is a continuation application of U.S. patent application Ser. No. 16/730,583 with a filing date of Dec. 30, 2019, and further claims priority benefits to Chinese Patent Application No. 201910795530.2, filed on Aug. 27, 2019. The contents of all of the aforementioned applications are incorporated herein by reference.

TECHNICAL FIELD

The present disclosure relates to the field of display technologies, and in particular, to a display panel and a display device.

BACKGROUND

With the development of the display technology, not only do people require a smooth user experience on electronic products, but also require better visual experiences, so a high screen ratio has become a current research direction. For the electronic products, provision of an optical module such as a front camera will inevitably occupy a certain space, thereby affecting the screen ratio. In order to achieve a true full screen, researchers are considering implementation schemes of under-screen optical modules.

Providing the optical module such as a camera under a light-emitting device of the display panel, i.e., providing the optical module in the display area, allows normal display to occur at a position of the optical module. When it is necessary to use the optical module, light penetrates the display panel to reach the optical module and is ultimately utilized by the optical module. In a structure of the display panel in the related art, there is a relatively small amount of light that can be received by the optical module, which affects the use performance of an optical module. How to improve the amount of light received by the optical module and improve the performance of the under-screen optical module is a technical problem that needs to be solved urgently.

SUMMARY

In view of this, embodiments of the present disclosure provide a display panel and a display device, aiming to improve transmittance of light passing through the display panel while improving performances of under-screen optical elements.

In a first aspect, the present disclosure provides a display panel. The display panel has a display area including an optical module arrangement region, a first display area and a second display area, The display panel includes: a plurality of pixels provided in the display area and the plurality of pixels include first pixels located in the optical module arrangement region, second pixels located in the first display area, and third pixels located in the second display area.

The display panel further includes pixel circuits including first pixel circuits, second pixel circuits, and third pixel circuits. The second pixel circuits are located in the first display area and electrically connected to the second pixels, the third pixel circuits are located in the second display area and electrically connected to the third pixels.

The first pixel circuits are electrically connected to the first pixels and at least some of the first pixel circuits are located in the first display area.

In a second aspect, the present disclosure provides a display device including any display panel provided by the present disclosure.

BRIEF DESCRIPTION OF DRAWINGS

In order to more clearly illustrate technical solutions of representative embodiments of the present disclosure, the accompanying drawings used in the embodiments are briefly described below.

DESCRIPTION OF EMBODIMENTS

In order to better understand technical solutions of the present disclosure, the embodiments of the present disclosure will be described in detail with reference to the drawings.

It should be noted that the described embodiments are representative embodiments of the present disclosure rather than all of the embodiments. Unless stated otherwise, features of embodiments described herein may be combined to form additional embodiments within the scope of the present disclosure.

The terms used in the embodiments of the present disclosure are for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein is an association describing the associated object, indicating that there may be three relationships. For example, A and/or B may indicate three cases: only A exists; A and B exist concurrently; only B exists. In addition, a character "/" herein generally indicates that the contextual objects are in an "or" relationship.

In view of the problems existing in the related art, the present disclosure provides a display panel, in which a first display area is provided between an optical module arrangement region and a second display area and a number of pixel circuits in the first display area is reduced by reducing a pixel density of the first display area, so that a part of pixel circuits for driving pixels located in the optical module arrangement region can be provided in the first display area. With a reasonable arrangement of the pixel circuits, a part of the pixel circuits are moved out of the optical module arrangement region, which increases an area of a light transmission region in the optical module arrangement region, thereby increasing a transmittance of light passing through the display panel in the optical module arrangement region while improving optical performances of the optical module.

Figure 1:
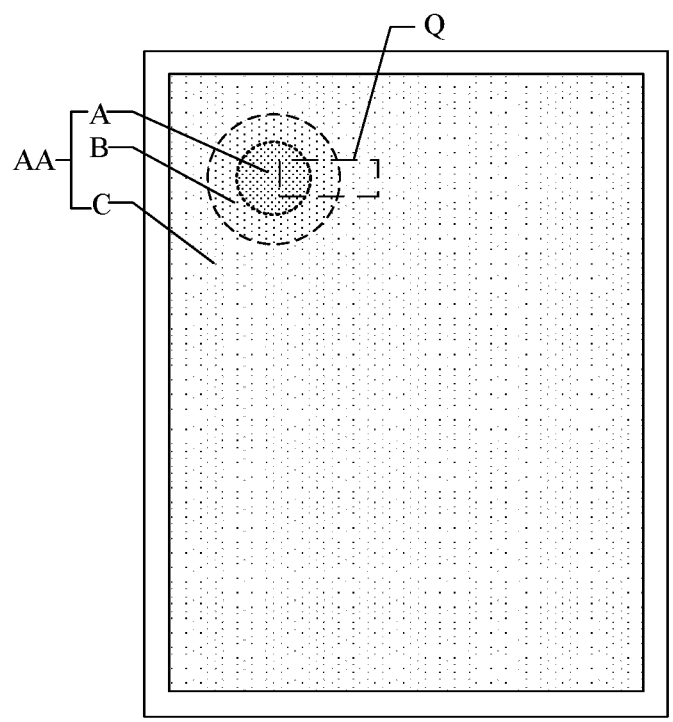
FIG. 1 is a schematic diagram of a display panel according to representative embodiments of the present disclosure.
Figure 2:
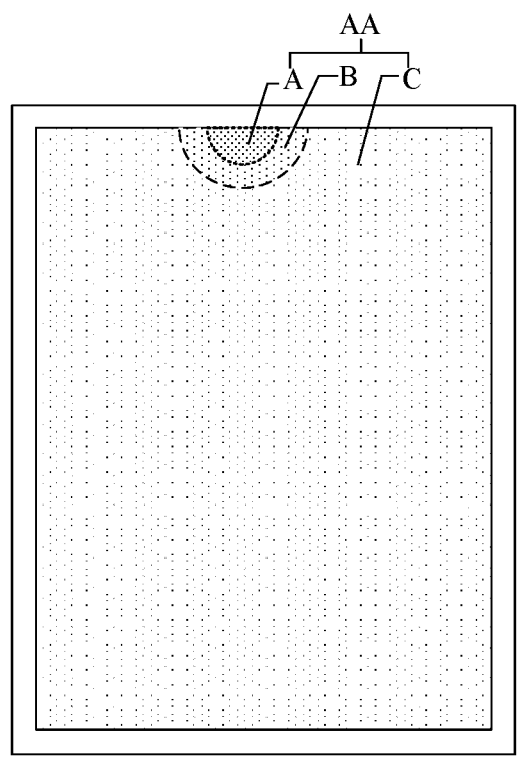
FIG. 2 is another schematic diagram of a display panel according to representative embodiments of the present disclosure.
Figure 3:
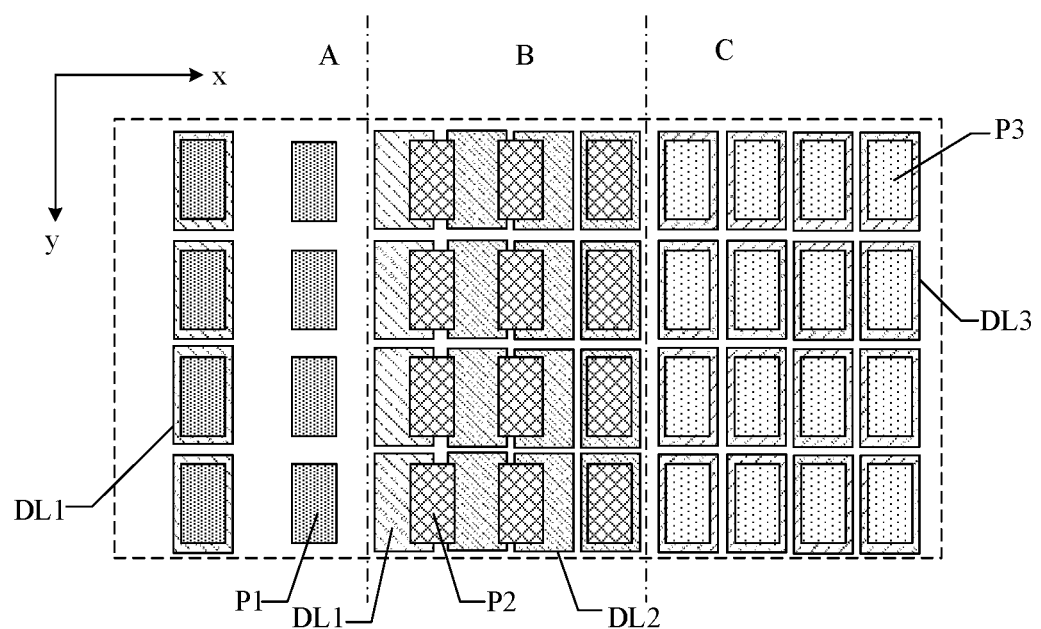
FIG. 3 is an enlarged schematic diagram of a part at a position Q of the display panel as shown in FIG. 1 according to representative embodiments of the present disclosure.

Representative embodiments of the present disclosure provide a display panel. The display panel has a display area. The display area includes an optical module arrangement region, a first display area and a second display area. The first display area surrounds at least a part of the optical module arrangement region, and the second display area surrounds at least a part of the first display area. FIG. 1 is a schematic diagram of a display panel according to some embodiments of the present disclosure. FIG. 2 is another schematic diagram of a display panel according to some embodiments of the present disclosure. FIG. 3 is an enlarged schematic diagram of a part at a position Q of the display panel as shown in FIG. 1 according to some embodiments of the present disclosure.

As shown in FIG. 1, the display panel has a display area AA, the display area AA includes an optical module arrangement region A, a first display area B and a second display area C. As an example, FIG. 1 illustrates that the first display area B encircles the optical module arrangement region A and the second display area C encircles the first display area B. As shown in FIG. 2, for example, in the display panel, the first display area B surrounds a half of the optical module arrangement region A and the second display area C surrounds a half of the first display area B. It should be noted that the present disclosure is not limited to any specific position of the optical module arrangement region in the display area, which can be set based on specific requirements in practice. Shapes of the optical module arrangement region A and the first display area B in FIGS. 1 and 2 are representative, and should not be construed as limiting the present disclosure.

Taking the display panel of FIG. 1 as an example, as shown in FIG. 3, a plurality of pixels is provided in the display area, the pixels include first pixels P1 located in the optical module arrangement region A, second pixels P2 located in the first display area B, and third pixels P3 located in the second display area C. A pixel density of the optical module arrangement region A is a first density, a pixel density of the first display area B is a second density, and a pixel density of the second display area C is a third density. The first density and the second density are both smaller than the third density. According to the present disclosure, the pixels are divided into the first pixels P1, the second pixels P2, and the third pixels P3 based on regions in which the respective pixels are located. The pixel density refers to a number of pixels included in each inch of a screen.

Still referring to FIG. 3, the display panel further includes pixel circuits. The pixel circuits include first pixel circuits DL1, second pixel circuits DL2, and third pixel circuits DL3. The second pixel circuits DL2 are located in the first display area B and electrically connected to the second pixels P2, the third pixel circuits DL3 are located in the second display area C and electrically connected to the third pixels P3, and the first pixel circuits DL1 are electrically connected to the first pixels P1 and at least some of the first pixel circuits DL1 are located in the first display area B. In the drawings, the pixel circuits are simplified. Taking the second display area C as an example, the third pixels P3 overlap the third pixel circuits DL3 for driving such pixels. In the optical module arrangement region A, the first pixel circuits DL1 that are not moved out of the region overlap the first pixels P1 driven thereby. In the first display area B, a part of the second pixels P2 overlap the second pixel circuits DL2 for driving such pixels (e.g., only overlap the second pixel circuits DL2), and another part of the second pixels P2 may overlap the first pixel circuits DL1 that are moved into the first display area B. As an example, the first pixel circuits DL1 that are moved into the first display area B may not overlap the second pixels P2.

Taking a first direction x and a second direction y as illustrated in FIG. 3 as an example, e.g., the first direction x is a row direction and the second direction y is a column direction, the pixel density of the optical module arrangement region A being smaller than the pixel density of the second display area C 3 can be achieved by reducing a number of pixel columns arranged in the second direction y, and the pixel density of the first display area B being smaller than the pixel density of the second display area C can be also achieved by reducing the number of pixel columns arranged in the second direction y. Alternatively, for both the optical module arrangement region A and the first display area B, the pixel density can also be reduced by reducing a number of pixel rows arranged in the first direction x. It is also possible that for both the optical module arrangement region A and the first display area B, the pixel density can be reduced by reducing the number of pixels arranged in both the first direction x and the second direction y.

The display panel according to some embodiments of the present disclosure can be an organic light-emitting display panel. The display panel includes light-emitting elements. Generally, one pixel includes one light-emitting element, and a region in which the light-emitting element is located is the light-emitting region of the pixel. The light-emitting element includes an anode, a light-emitting layer and a cathode that are sequentially stacked. In order to improve the light utilization rate, the anode is usually formed into a reflective anode. Light emitted from the light-emitting layer penetrates the cathode to achieve light-emitting and display of the pixel. There is very little light emitted from the light-emitting layer that can penetrate the anode, so a region in which the light-emitting element is located is usually considered as a non-light transmission region of the display panel. The non-light transmission region refers to a region where light cannot penetrate. In addition, since the display panel further includes pixel circuits for driving the pixels to emit light and various metal traces, which may block light, causing light to not penetrate the display panel. Therefore, a region in which the pixel circuits and metal traces are located also belongs to the non-light transmission region. A region between two adjacent light-emitting elements in the display area of the display panel is not entirely a light-transmission area. Therefore, an area of the whole light-transmission area in the display area is very small, so that an amount of light that can penetrate the display panel is small. When an under-screen optical module solution is applied, the amount of light that can be utilized by the optical module is small, resulting in poor optical performances of the under-screen optical module, thereby affecting the user experience.

In some embodiments of the present disclosure, the optical module arrangement region A is an optical module reserve region, and has a smaller pixel density than the second display area C. When assembled into a display device, an optical module such as a camera can be provided at a position corresponding to the optical module arrangement region A. When a display function is required, normal display can be performed in the optical module arrangement region A. When a camera function is required, light can pass through the display panel from the optical module arrangement region and then be utilized by the camera. With the present disclosure, the pixel density of the optical module arrangement region A is smaller than the pixel density of the second display area C, and then the number of pixels in the optical module arrangement region is decreased and thus the number of pixel circuits for driving the pixels to perform display is also decreased, thereby reducing an area of the non-light transmission region in the optical module arrangement region. Correspondingly, areas of the corresponding light transmission regions will increase, which can increase the amount of light that penetrates the optical module arrangement region while improving the optical performance of the optical module under the screen. Further, according to the present disclosure, the first display area B is provided between the optical module arrangement region A and the second display area C, and the pixel density of the first display area B is smaller than the pixel density of the second display area C. Thus, the number of the second pixel circuits that need to be provided in the first display area B is decreased. The present disclosure arranges at least some of the first pixel circuits in the first display area. That is, by reducing the pixel density of the first display area, a part of the pixel circuits for driving the first pixels in the optical module arrangement region can be provided in the first display area. With a reasonable arrangement of the pixel densities and the pixel circuits, at least some of the pixel circuits are moved out of the optical module arrangement region, which increases an area of a light transmission region in the optical module arrangement region, thereby increasing a transmittance of light passing through the display panel in the optical module arrangement region while improving optical performances of the under-screen optical module.

Figure 4:
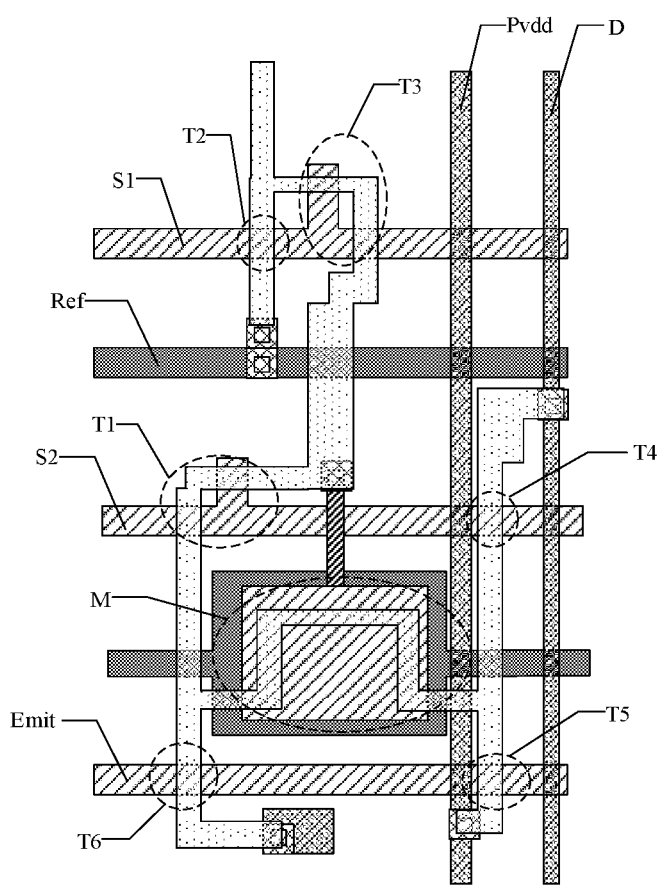
FIG. 4 is a schematic diagram of a pixel circuit of a display panel according to representative embodiments of the present disclosure.

FIG. 4 is a schematic diagram of a pixel circuit of a display panel according to some embodiments of the present disclosure. As shown in FIG. 4, the pixel circuit includes a first scan line S1, a second scan line S2, a light-emitting control signal line Emit, a data line D, a power signal line Pvdd, a reset signal line Ref, first to sixth switches (T1 to T6), also referred to as transistors, and a driver M. The pixel circuit usually includes a plurality of transistors (also referred to as switches) and a plurality of signal lines. In order to drive the display panel to perform display, the pixel circuits are densely arranged in an array layer of the display panel. It should be noted that the pixel circuit in FIG. 4 is representative and is not intended to limit the present disclosure.

In the display panel according to some embodiments of the present disclosure, a region corresponding to the optical module under the screen is reserved as the optical module arrangement region. For example, when applying an under-screen camera solution, a gap between various signal lines in the pixel circuit (referring to FIG. 4, e.g., a gap between the data line D and the power signal line Pvdd, a gap between the first scan line S1 and the reset signal line Ref, and the like) can diffract light that passes through the optical module arrangement region, which is then utilized by the camera. This will seriously affect an imaging quality of the camera. Therefore, the present disclosure further increases sizes of a part of the second pixels that are located in the optical module arrangement region and adjacent to the first display area, and then uses the second pixels for covering the gap between traces in the pixel circuit, thereby alleviating diffraction impact on the performance of optical module.

Figure 5:
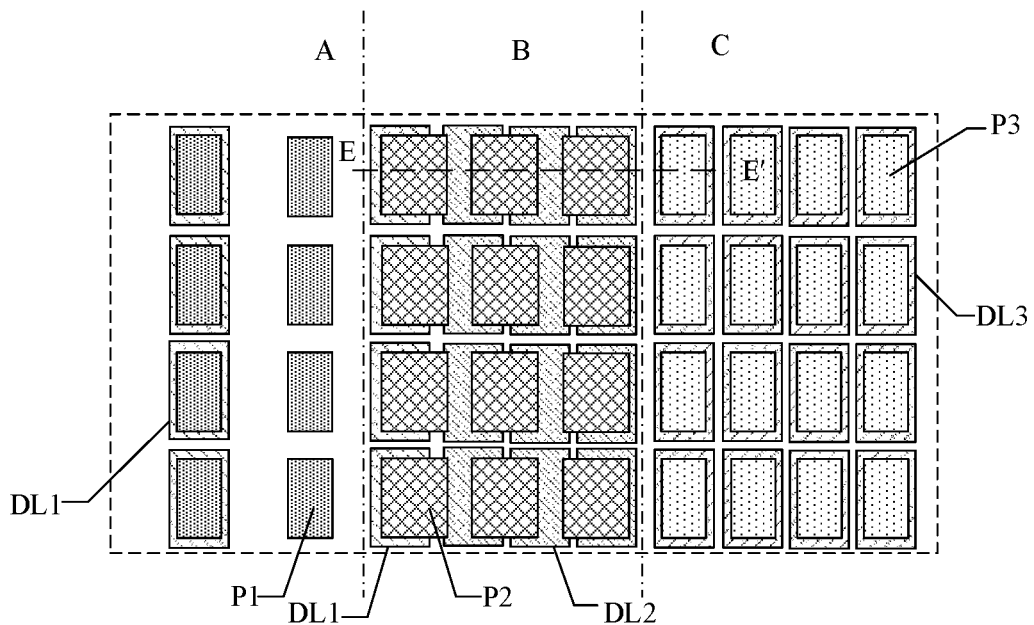
FIG. 5 is another enlarged schematic diagram of a part at a position Q of the display panel as shown in FIG. 1 according to representative embodiments of the present disclosure.

In some embodiments, FIG. 5 is another enlarged schematic diagram of a part at a position Q of the display panel as shown in FIG. 1 according to some embodiments of the present disclosure. As shown in FIG. 5, an area of the second pixel P2 is larger than that of the third pixel P3. In the first display area B, a part of the second pixels P2 overlap the first pixel circuits DL1, thereby covering at least some of gaps between traces of the first pixel circuits DL1. The pixel in the display panel includes an anode, a light-emitting layer, and a cathode that are sequentially stacked in a direction perpendicular to the display panel. Viewed from the top of FIG. 5, the anode, the light-emitting layer, and the cathode overlap, and a structure having the largest area among the anode, the light-emitting layer, and the cathode defines an area of the corresponding pixel.

Figure 6:
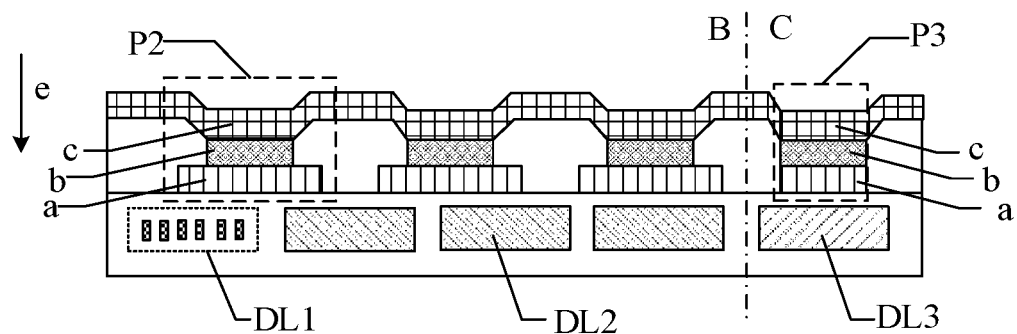
FIG. 6 is a cross-sectional schematic diagram taken along line E-E' in FIG. 5 according to representative embodiments of the present disclosure.

In some embodiments, areas of anodes of a part of the second pixels are increased, so that the second pixels can be used to cover gaps between traces in the first pixel circuits. FIG. 6 is a cross-sectional schematic diagram taken along line E-E' in FIG. 5 according to some embodiments of the present disclosure. As shown in FIG. 6, a pixel includes an anode a, a light-emitting layer b, and a cathode c that are sequentially stacked. An area of the anode a of the second pixel P2 is larger than an area of the anode a of the third pixel P3. In a direction e perpendicular to a plane of the display panel, the anodes of at least some of the second pixels P2 overlap a gap between traces of the first pixel circuits DL1. The actual pixel circuit has complicated wiring, and a circuit structure and the gap between traces cannot be completely illustrated in the cross-sectional view. In FIG. 6, the gap between traces in the first pixel circuit DL1 is schematically shown. FIG. 6 illustrates that an area of an anode of a second pixel P2 that does not overlap the first pixel circuit DL1 also becomes larger. For example, it is possible to set the area of the anode of the second pixel P2 that overlaps the first pixel circuit DL1 to be larger than that of the third pixel. In the display panel according to the present embodiment, the pixel density of the first display area is smaller than that of the second display area, which reduces the number of second pixel circuits provided in the first display area for driving the second pixels, and then at least some of the first pixel circuits are provided in the first display area, which can increase the amount of light that penetrates the optical module transmission while improving the optical performance of the optical module under the screen. Further, the area of the anode of the second pixel is set to be larger than the area of the anode of the third pixel, and a blocking performance of the anode of the second pixel can be used to block a gap between at least some of traces of the first pixel circuits, thereby reducing diffraction of light around the optical module arrangement region so as to improve performances of the optical module when applying the under-screen optical module solution.

As an example, the gap between traces of the first pixel circuit located in the first display area is completely covered by the anodes of the second pixels. In some embodiments of the present disclosure, at least some of the first pixel circuits is disposed in the first display area, so that the number of the first pixel circuits disposed in the optical module arrangement region can be reduced, which reduces an area of the non-light transmission region in the optical module arrangement region and correspondingly increases the area of the light transmission region, thereby improving the light transmittance of the optical module arrangement region and thus improving light available to the optical module under the screen in the optical module arrangement region. Further, the gap between traces of the first pixel circuits in the first display area is completely covered by the anode of the second pixel, which can minimize and eliminate light diffraction caused by the wiring of the first pixel circuits in the first display area, thereby effectively improving performances of the optical module when applying the under-screen optical module solution.

Figure 7:
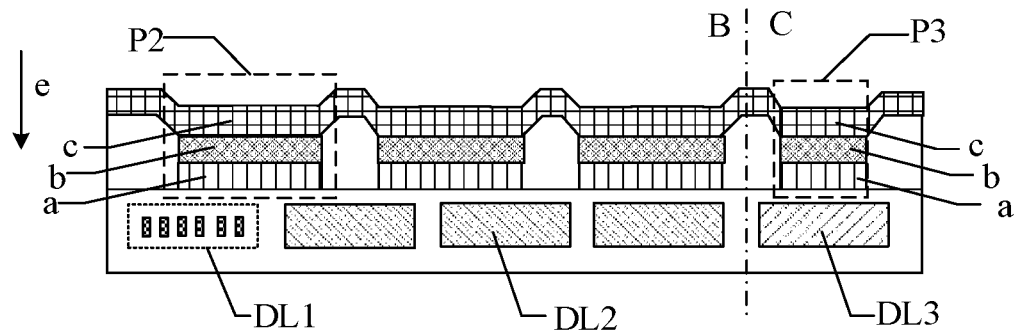
FIG. 7 is another cross-sectional schematic diagram taken along line E-E' in FIG. 5 according to representative embodiments of the present disclosure.

In some embodiments, a light-emitting area of the second pixel is larger than that of the third pixel. By increasing areas of anodes, light-emitting layers area, and cathodes of a part of the second pixels at the same time, the second pixels can be used to block the gap between traces of the first pixel circuits. FIG. 7 is another cross-sectional schematic diagram taken along line E-E' in FIG. 5 according to some embodiments of the present disclosure. As shown in FIG. 7, a pixel includes an anode a, a light-emitting layer b, and a cathode c that are sequentially stacked. The light-emitting area of the second pixel P2 is larger than that of the third pixel P3. The area of the anode a of the second pixel P2 is larger than the area of the anode a of the third pixel P3. The area of the light-emitting layer b of the second pixel P2 is larger than the area of the light-emitting layer b of the third pixel P3. FIG. 7 illustrates that the areas of the anode and the light-emitting layer of the second pixel P2 that does not overlap the first pixel circuit DL1 are also increased. For example, it is possible to increase the areas of the anode and the light-emitting layer of the second pixel P2 that overlaps the first pixel circuit DL1. In this embodiment, at least some of the first pixel circuits are disposed in the first display area, which can increase the area of the light transmission region in the optical module arrangement region while improving the light transmittance of the optical module arrangement region. Further, the light-emitting area of the second pixel is increased, and at least some of the gap between traces of the first pixel circuits are blocked by the second pixels, so as to reduce the diffraction effect of the light by the gap between traces of the first pixel circuits, that is to reduce diffraction of light around the optical module arrangement region, thereby improving performances of the optical module when applying the under-screen optical module solution. In addition, according to the present disclosure, the pixel density of the first display area is smaller than the pixel density of the second display area. In order to ensure that the brightness of the first display area is consistent with that of the second display area, it may be needed to provide a data voltage signal for increasing the second pixels. In this embodiment, after the light-emitting area of the second pixel becomes larger, a current density of the second pixels can be correspondingly reduced, thereby facilitating improving lifetime of the second pixels.

In some embodiments, in the display panel, the number of the first pixels in the optical module arrangement region is N, and the number of the first pixel circuits in the first display area is n, where $0.3 \le n/N \le 0.8$. n/N represents a proportion of the first pixel circuits in the first display area among all the first pixel circuits. n/N=0.3 means that 30% of the first pixel circuits are moved out of the optical module arrangement region and then disposed in the first display area, and n/N=0.8 means that 80% of the first pixel circuits are moved out of the optical module arrangement region and then disposed in the first display area. In a practical application, the proportion of the first pixel circuits to be designed in the first display area is related to factors such as a size of the optical module arrangement region, the pixel density of the first display area, a total number of pixel circuits that can be arranged in the first display area, a degree of difficulty of manufacturing process, display effects in the first display area and the optical module arrangement region, and the like. After comprehensive consideration of the influence of various factors, it is designed that $0.3 \le n/N \le 0.8$. In this design, the pixel density of the first display area does not need to be too small, so as to ensure that there is no obvious display boundary between the first display area and the second display area during normal display and more first pixel circuits can be placed in the first display area, which can greatly increase an area of the light first display area of the optical module arrangement region while improving the light transmittance. For example, in the display area, the pixels and the pixel circuits are electrically connected in one-to-one correspondence.

Figure 8:
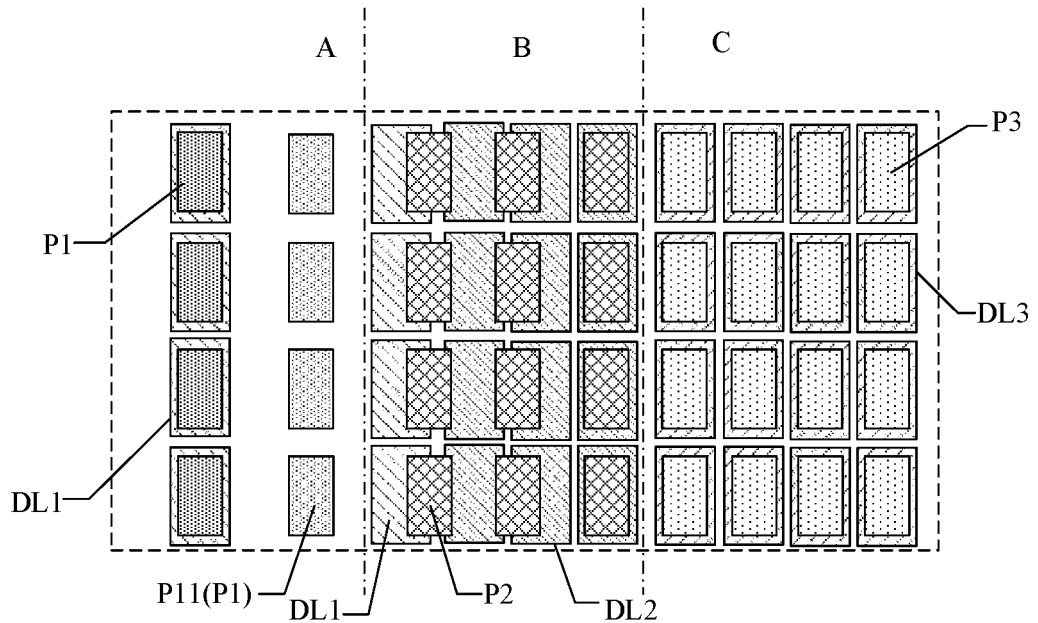
FIG. 8 is a schematic diagram of a part of a display panel according to representative embodiments of the present disclosure.

FIG. 8 is a schematic diagram of a part of a display panel according to some embodiments of the present disclosure. As shown in FIG. 8, the first pixels P1 include first edge pixels P11, and the first edge pixels P11 are adjacent to the first display area B. At least some of the first pixel circuits DL1 that are electrically connected to the first edge pixels P11 are located in the first display area. B. The pixel circuits for driving pixels to perform display in the display panel are also densely arranged. The first edge pixels are adjacent to the first display area. In this embodiment, the first pixel circuits that are electrically connected to the first edge pixels are provided in the first display area. Such pixel circuits are adjacent to the first display area until some design changes are made, and then are moved into the first display area during the manufacturing. This has little impact on arrangement of other pixel circuits in the display panel, and the process is simple.

Figure 9:
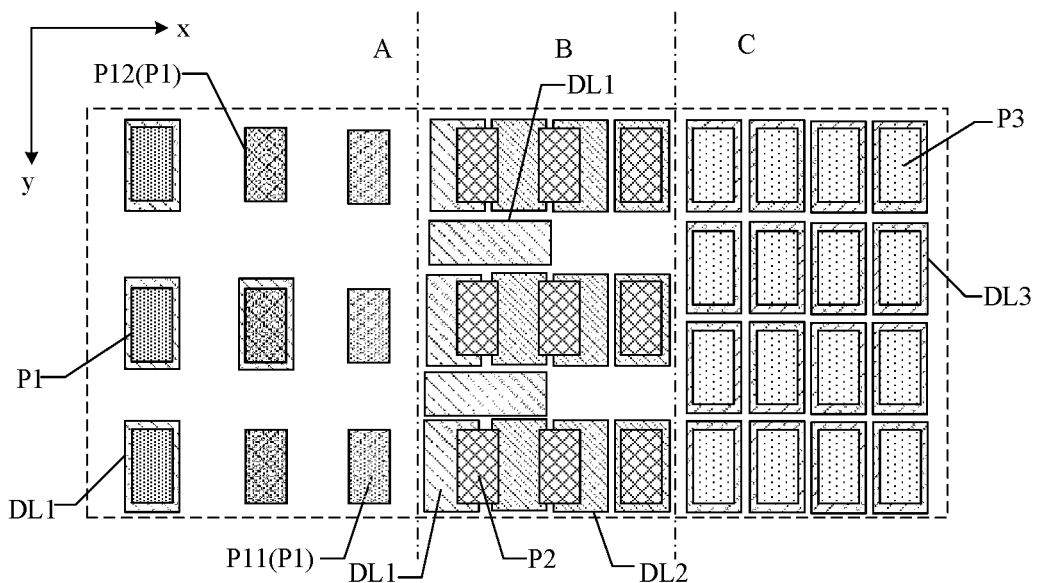
FIG. 9 is another schematic diagram of a part of a display panel according to representative embodiments of the present disclosure.

FIG. 9 is another schematic diagram of a part of a display panel according to some embodiments of the present disclosure. As shown in FIG. 9, the first pixels P1 further include secondary edge pixels P12. The secondary edge pixels P12 are located at a side of the first edge pixels P11 facing away from the first display area B and are adjacent to the first edge pixels P11. At least some of the first pixel circuit DL1 electrically connected to the first edge pixels P11 are located in the first display area B, and at least some of the first pixel circuit DL1 electrically connected to the secondary edge pixels P12 are located in the first display area B. The secondary edge pixels P12 are spaced from the first display area by the first edge pixels P11, that is, the secondary edge pixels P12 are closer to the first display area. The first pixel circuits DL1 electrically connected to the secondary edge pixels P12 are moved into the first display area B. The overall arrangement of the pixel circuits in the display panel has less impact, is relatively simple in design, and has low process difficulty.

It should be noted that the arrangement of the pixel circuits in the first display area B in FIG. 9 is representative. After providing at least some of the first pixel circuits DL1 in the first display area, it may have an impact on the arrangement of the second pixel circuits DL2 in the first display area. In the actual manufacturing, after a circuit structure of a pixel circuit is determined, the pixel circuit occupies a basically unchanged area, but an arrangement position of each component in the pixel circuit can be adjusted to achieve an adjustment of occupied lengths of the pixel circuit in the first direction x and the second direction y as shown in FIG. 9, so as to achieve a reasonable arrangement of the pixel circuits in the first display area B in such a manner that at least some of the first pixel circuits are arranged in the first display area B, thereby increasing the area of the light transmission area in the optical module arrangement region A while increasing the light transmittance of the optical module arrangement region A.

Figure 10:
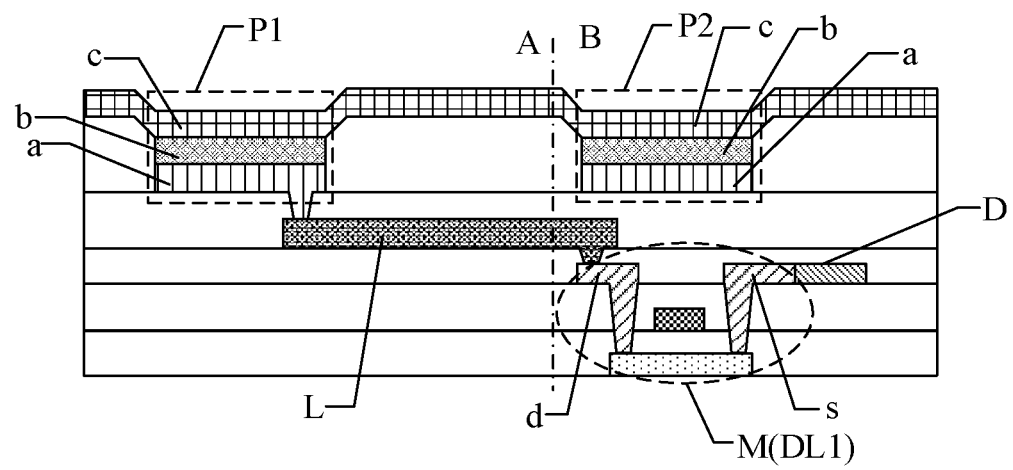
FIG. 10 is a schematic diagram illustrating a film layer structure of a display panel according to representative embodiments of the present disclosure.

FIG. 10 is a schematic diagram illustrating a film layer structure of a display panel according to some embodiments of the present disclosure. As shown in FIG. 10, the pixel includes an anode a, a light-emitting layer b, and a cathode c that are sequentially stacked. The display panel further includes a first connection trace L. The first pixel circuit DL1 located in the first display area is electrically connected to the anode a of the first pixel P1 via the first connection trace L. The display panel further includes a data line D, and the first connection trace L and the data line D are disposed in different layers. The data line D provides a data signal to the pixel circuit. The figure illustrates a driver M in the pixel circuit, a drain d of the driver M is electrically connected to the anode a of the pixel, and a source s of the driver M is electrically connected to the data line D. The drain d of the driver M of the first pixel circuit DL1 is connected to the first connection trace L, and the first connection trace L and the anode a are disposed in different layers and electrically connected to each other through a via. The driver M in FIG. 10 is schematically described in a top-gate structure. In a display panel in the related art, usually, a pixel circuit is disposed below a pixel, and a drain of a driver in the pixel circuit and an anode of the pixel are electrically connected to each other through a via on an insulating layer. In some embodiments of the present disclosure, at least some of the first pixel circuits electrically connected to the first pixels are disposed in the first display area, that is, the first pixel circuits located in the first display area and the first pixels driven thereby are misaligned. On this basis, a first solution lies in that a wiring made in the same layer as the anode and electrically connected to the anode extends to a position corresponding to the drain of the driver, and then is electrically connected to the drain through a via, and a second solution lies in that a wiring made in the same layer as the drain of the driver and electrically connected to the drain extends to a position corresponding to the anode of the pixel, and then is electrically connected to the anode through a via. For the first solution, since the wiring made in the same layer as the anode occupies a certain space at a position of the optical module arrangement region adjacent to the first display area, the first pixels and the second pixel do not overlap the wiring in a direction perpendicular to the display panel, which will adversely affect the solution in which the second pixels cover the gap between traces of the first pixel circuits. For the second solution, since the wiring in the pixel circuit in the display panel is complex and dense, if the wiring is simply made in the same layer as the drain, the arrangement of the pixel circuits needs to be changed in order to avoid short circuit. In view of this, a further embodiment is proposed, in which a first connection trace provided in a different layer from the data line is added. The first connection trace achieves an electrical connection between the first pixel circuit located in the first display area and the first pixel located in the optical module arrangement region, thereby improving the light transmittance of the optical module arrangement region while introducing little impact on the arrangement of the pixel circuits in the first display area and causing the simple manufacturing process.

Figure 11:
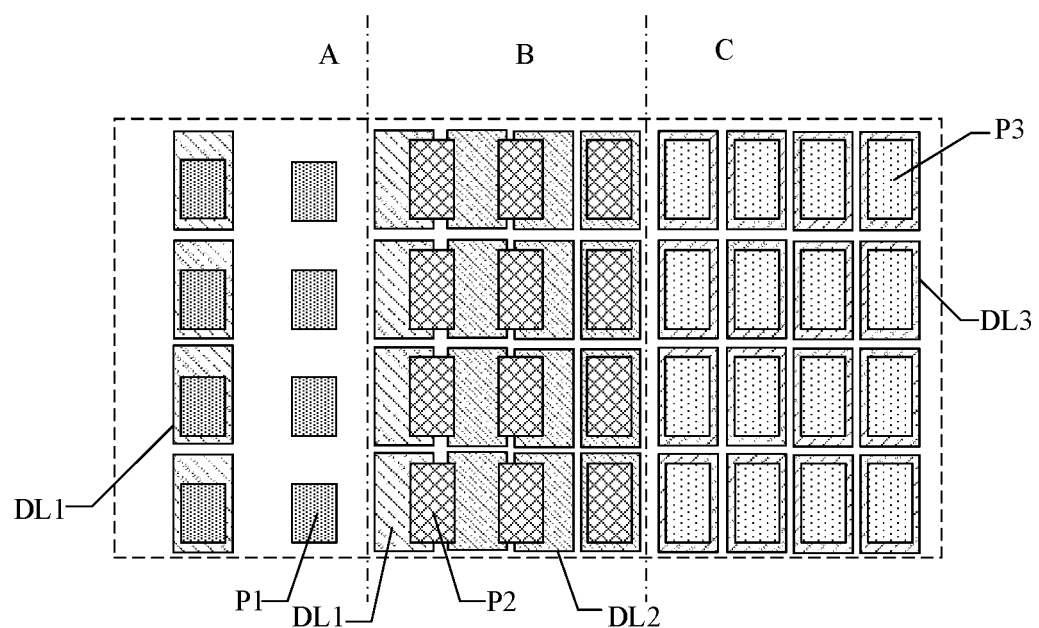
FIG. 11 is another schematic diagram of a part of a display panel according to representative embodiments of the present disclosure.

FIG. 11 is another schematic diagram of a part of a display panel according to some embodiments of the present disclosure. As shown in FIG. 11, the light-emitting area of the first pixel P1 is smaller than that of the third pixel P3. In this embodiment, the pixel density of the optical module arrangement region is smaller than that of the second display area, and the amount of light that penetrates the optical module arrangement region is increased. A first display area is provided between the optical module arrangement region and the second display area, and has a smaller pixel density than the second display area. At least some of the first pixel circuits are provided in the first display area, that is, by reducing the pixel density of the first display area, a part of the pixel circuits for driving the first pixels in the optical module arrangement region can be provided in the first display area, which can reduce the area of the non-light transmission region in the optical module arrangement region, thereby correspondingly increasing the area of the light transmission region in the optical module arrangement region. Further, the light-emitting area of the first pixels in the optical module arrangement region is smaller than that of the second display area, which can further reduce the area of the non-light transmission region in the optical module arrangement region, thereby increasing transmittance of the light penetrating the display panel in the optical module arrangement region.

Figure 12:
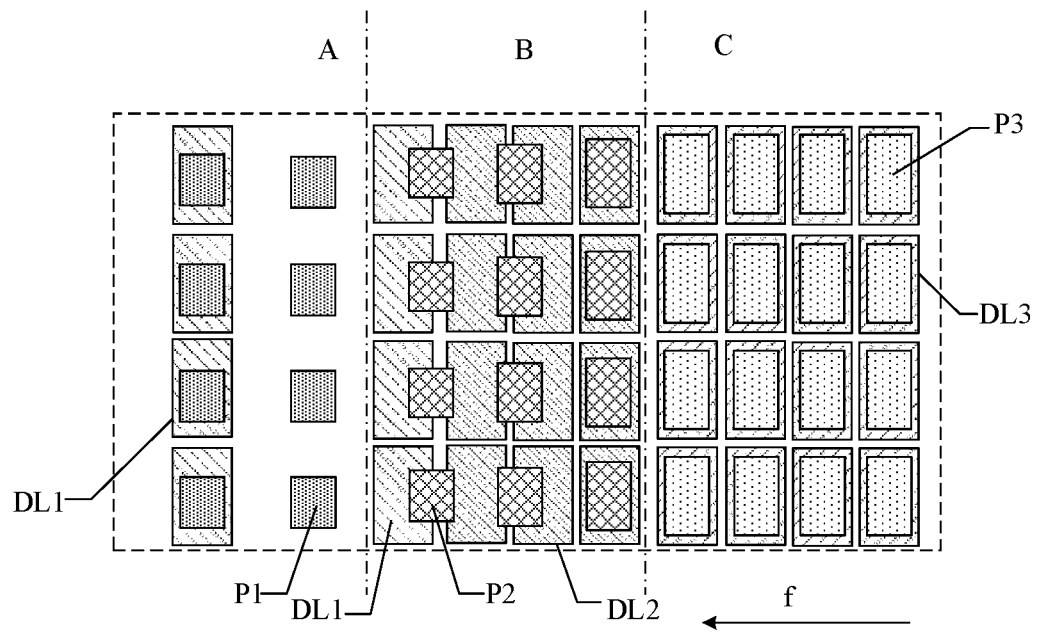
FIG. 12 is another schematic diagram of a part of a display panel according to representative embodiments of the present disclosure.

FIG. 12 is another schematic diagram of a part of a display panel according to some embodiments of the present disclosure. As shown in FIG. 12, the light-emitting area of the first pixel P1 is smaller than that of the third pixel P3. In a direction f from the second display area C to the optical module arrangement region A, the light-emitting areas of the second pixels P2 gradually decrease. In this embodiment, at least some of the first pixel circuits are provided in the first display area, and the light-emitting area of the first pixel is smaller than that of the third pixel, thereby improving the light transmittance of the optical module arrangement region. Further, in a direction from the second display area towards the optical module arrangement region, the light-emitting areas of the second pixels gradually decrease, thereby ensuring that the second display area gradually transitions to the optical module arrangement region during display while preventing the human eye from differentiating display between the second display area and the first display area or between the optical module arrangement region and the first display area. This embodiment can improve the display effect. For example, the light-emitting area of the second pixel is smaller than or equal to the light-emitting area of the third pixel.

In some embodiments, the light-emitting area of the first pixel is smaller than the light-emitting area of the third pixel, and the light-emitting areas of the second pixels gradually increase first and then gradually decrease in the direction from the second display area towards the optical module arrangement region. This embodiment improves the light transmittance of the optical module arrangement region, and also achieves that the second display area gradually transitions to the optical module arrangement region during display while preventing the human eye from differentiating display between the second display area and the first display area or between the optical module arrangement region and the first display area. For example, the light-emitting area of the second pixel is greater than or equal to the light-emitting area of the third pixel.

Figure 13:
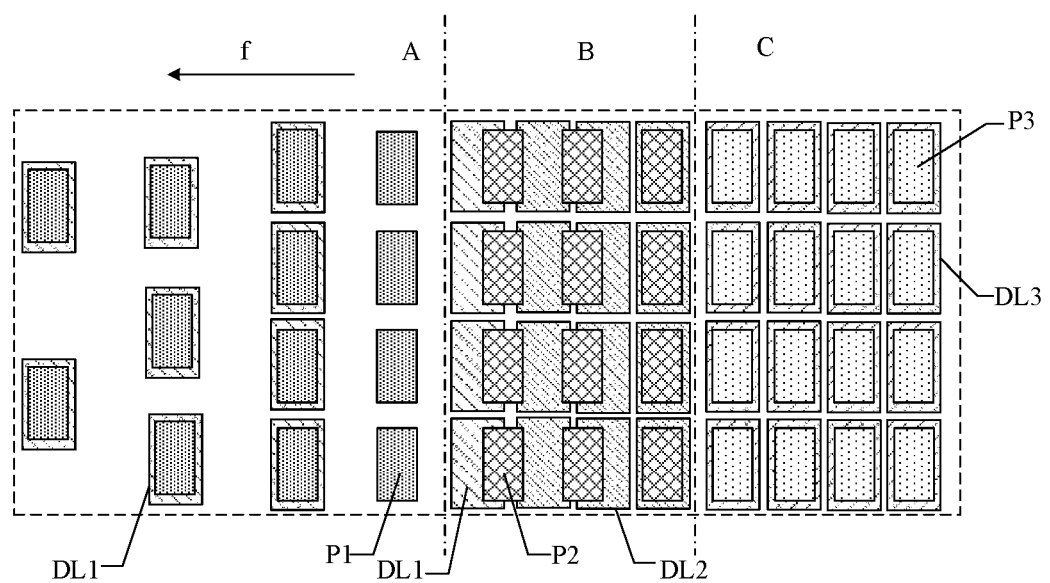
FIG. 13 is another schematic diagram of a part of a display panel according to representative embodiments of the present disclosure.

FIG. 13 is another schematic diagram of a part of a display panel according to some embodiments of the present disclosure. As shown in FIG. 13, the light-emitting area of the first pixel P1 is the same as that of the third pixel P3, and the pixel density of the optical module arrangement region A gradually increases in the direction f from the second display area C to the optical module arrangement region A. In this embodiment, at least some of the first pixel circuits are first disposed in the first display area, thereby improving the light transmittance of the optical module arrangement region. Further, the pixel density of the optical module arrangement region gradually decreases in the direction from the second display area towards the optical module arrangement region. The pixel density of the optical module arrangement region gradually changes along one direction, display in the optical module arrangement region changes uniformly during display, and thus it is not easy for the human eye to recognize the display difference. In addition, as the pixel density gradually decreases, the number of pixels provided in the optical module arrangement region can be further reduced, thereby further improving the light transmittance of the optical module arrangement region.

As an example, in the embodiment corresponding to FIG. 13, the light-emitting area of the second pixel can be set to be the same as that of the third pixel, the light-emitting area of all pixels in the display area can be set to be the same, the pixel density of the first display area can be set to be smaller than that of the second display area, and the pixel density of the first display area is greater than that of the optical module arrangement region. In this way, in the direction from the second display area towards the optical module arrangement region, the light-emitting area of the pixel does not change, but the pixel density gradually changes, which can achieve a uniform transition during the display while improving the display effect.

As another example, in the embodiment corresponding to FIG. 13, the light-emitting area of the second pixel can alternatively be set to be larger than that of the third pixel. The second pixels can be arranged in the first display area to block at least some of the gap between traces of the first pixel circuits, which can reduce the diffraction effect of the gap between traces of the first pixel circuits on the light penetrating the display panel, thereby improving performances of the optical module when applying the under-screen optical module scheme. For example, it is also possible that the light-emitting areas of the second pixels gradually increase first and then decrease in the direction from the second display area to the optical module arrangement region, so that the light-emitting area of the second pixel is larger than that of the third pixel, and the light-emitting area of the second pixel is larger than the light-emitting area of the first pixel. The first display area is located between the second display area and the optical module arrangement region. That is, the light-emitting areas of the pixels gradually change by first increasing and then decreasing in the direction from the second display area towards the optical module arrangement region, thereby achieving a uniform transition during display while improving the display effect.

It should be noted that FIG. 13 illustrates a part of the optical module arrangement region A, a part of the first display area B, and a part of the second display area C. For the embodiment in which the first display area B surrounds the optical module arrangement region A and the second display area C surrounds the first display area B, it is possible that the pixel density of the optical module arrangement region A gradually decreases in a direction from the second display area C towards a geometric center of the optical module arrangement region A.

Figure 14:
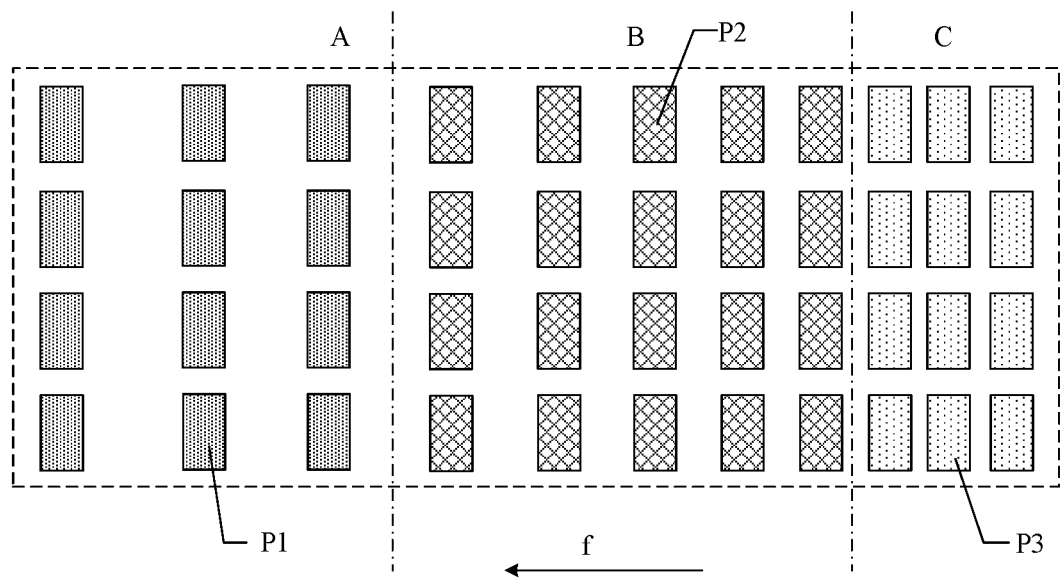
FIG. 14 is another schematic diagram of a part of a display panel according to representative embodiments of the present disclosure.

FIG. 14 is another schematic diagram of a part of a display panel according to some embodiments of the present disclosure. As shown in FIG. 14, in the direction from the second display area C towards the optical module arrangement region A, the pixel density of the first display area B gradually decreases. In order to clearly illustrate the change in pixel density, the pixel circuits in the display panel are not shown in the figure. In this embodiment, at least some of the first pixel circuits are provided in the first display area, and the light transmittance of the optical module arrangement region is improved. Further, the pixel density of the first display area gradually decreases in the direction from the second display area to the optical module arrangement region. The setting of the first display area ensures that the display gradually transitions along a direction from the second display area towards the optical module arrangement region during display, thereby improving the display effect. For example, the pixel density of the first display area can be set to be greater than the pixel density of the optical module arrangement region, which can further achieve a uniform transition from the first display area to the optical module arrangement region.

Figure 15:
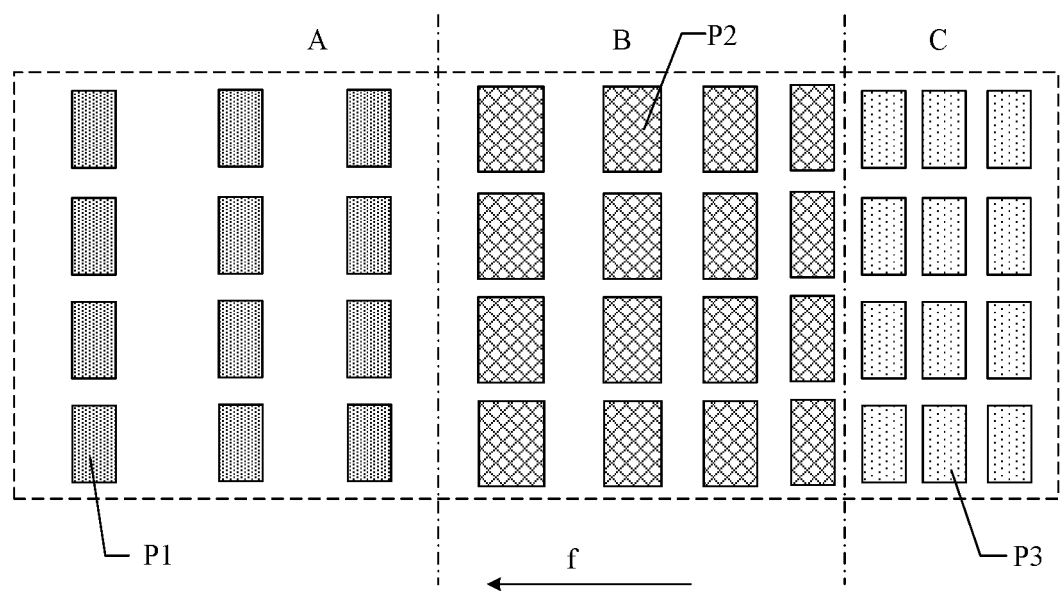
FIG. 15 is another schematic diagram of a part of a display panel according to representative embodiments of the present disclosure.

FIG. 15 is another schematic diagram of a part of a display panel according to some embodiments of the present disclosure. As shown in FIG. 15, in the direction from the second display area C towards the optical module arrangement region A, the pixel density of the first display area B gradually decreases. In the direction from the second display area C towards the optical module arrangement region A, the light-emitting areas of the second pixels P2 gradually increase. In this embodiment, based on the implementation of FIG. 14, the light-emitting areas of the second pixels gradually increase, which can balance the difference in display brightness caused by the gradually decreasing of the pixel density in the first display area while achieving uniform display brightness in the first display area. In addition, after the light-emitting areas of the second pixels increase, at a position in the first display area adjacent to the optical module arrangement region, the second pixels can be used to block the gap between traces of the first pixel circuits located in the first display area, which can reduce the diffractive effect of the gap between traces on light, thereby reducing the impact of the diffraction of light around the optical module arrangement region on the performances of the under-screen optical module.

Figure 16:
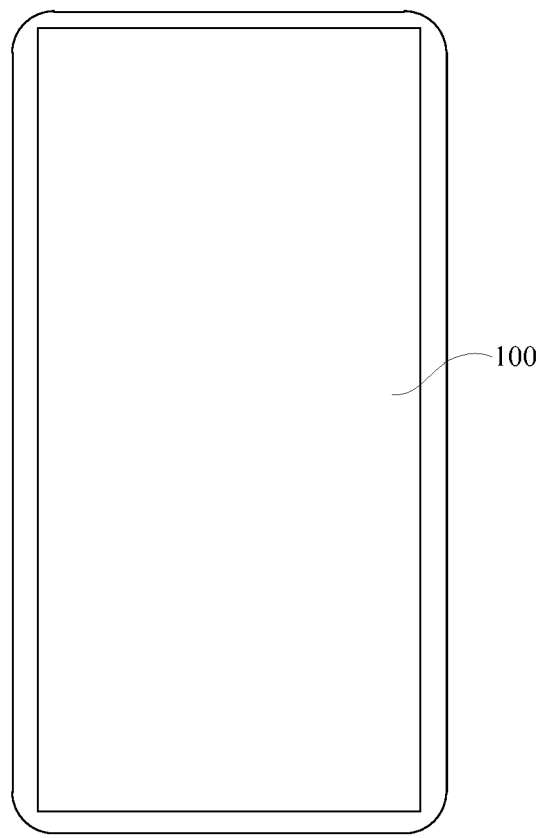
FIG. 16 is a schematic diagram of a display device according to representative embodiments of the present disclosure.

Based on the same inventive concept, the present disclosure also provides a display device. FIG. 16 is a schematic diagram of a display device according to some embodiments of the present disclosure. As shown in FIG. 16, the display device includes the display panel 100 provided by any embodiment of the present disclosure. The specific structure of the display panel 100 has been described in detail in the above embodiments, and details are not described herein again. Without doubt, the display device shown in FIG. 16 is representative, and the display device can be any electronic device having a display function such as a mobile phone, a tablet computer, a notebook computer, an electronic paper book, or a television set.

The above describes representative embodiments of the present disclosure and is not intended to limit the present disclosure. Any modifications, equivalent substitutions, improvements, etc. made within the spirit and principle of the present disclosure are intended to be included within the scope of the present disclosure.

What is claimed is:

1. A display panel having a display area comprising an optical module arrangement region, a first display area, and a second display area, the display panel comprising:
  a plurality of pixels provided in the display area, the plurality of pixels comprising first pixels located in the optical module arrangement region, second pixels located in the first display area, and third pixels located in the second display area; and
  pixel circuits comprising first pixel circuits, second pixel circuits, and third pixel circuits, wherein the second pixel circuits are located in the first display area and electrically connected to the second pixels, and the third pixel circuits are located in the second display area and electrically connected to the third pixels, and
  the first pixel circuits are electrically connected to the first pixels and transistors of at least some of the first pixel circuits that are located in the first display area;
  wherein along a row direction, a distance between two adjacent first pixel circuits is L1, and a distance between other two adjacent first pixel circuits is L2, and a width of the first pixel is L3, where L1>L2, and L1>L3;
  wherein the display panel further comprises a virtual line extending along a column direction and passing through the optical module arrangement region, and the adjacent first pixel circuits having the distance of L1 and the adjacent first pixel circuits having the distance of L2 are located on a same side of the virtual line.

2. The display panel according to claim 1, wherein,
each of the plurality of pixels comprises an anode, and
in a direction perpendicular to a plane of the display panel, anodes of at least some of the second pixels overlap a gap between traces of the first pixel circuits.

3. The display panel according to claim 2, wherein individual areas of the anodes of the second pixels are larger than individual areas of the anodes of the third pixels.

4. The display panel according to claim 1, wherein
an arrangement position of a component in the first pixel circuits in the first display area is different from an arrangement position of the third pixel circuits in the second display area.

5. The display panel according to claim 1, wherein,
each of the plurality of pixels comprises an anode;
the display panel further comprises first connection traces, and the at least some of the first pixel circuits in the first display area are electrically connected to the anodes of the first pixels through the first connection traces; and
a film layer of the anodes the first pixels is located in a same layer as at least some of the first connection traces.

6. The display panel according to claim 1, wherein each of the first pixels has a smaller light-emitting area than light-emitting areas of the third pixels.

7. The display panel according to claim 1, wherein each of the second pixels has a smaller light-emitting area than light-emitting areas of the third pixels.

8. The display panel according to claim 1, wherein each of the second pixels has a same light-emitting area as light-emitting areas of the third pixels.

9. The display panel according to claim 1, wherein a number of the first pixels located in the optical module arrangement region is N, and a number of the at least some of the first pixel circuits located in the first display area is n, where 0.3≤n/N≤0.8.

10. A display device, comprising a display panel, the display panel having a display area comprising an optical module arrangement region, a first display area and a second display area, the display panel comprising:
  a plurality of pixels provided in the display area, the plurality of pixels comprising first pixels located in the optical module arrangement region, second pixels located in the first display area, and third pixels located in the second display area; and
  pixel circuits comprising first pixel circuits, second pixel circuits, and third pixel circuits, wherein the second pixel circuits are located in the first display area and electrically connected to the second pixels, the third pixel circuits are located in the second display area and electrically connected to the third pixels, and the first pixel circuits are electrically connected to the first pixels, and at least some of the first pixel circuits are located in the first display area;
  wherein along a row direction, a distance between two adjacent first pixel circuits is L1, and a distance between other two adjacent first pixel circuits is L2, and a width of the first pixel is L3, where L1>L2, and L1>L3;
  wherein the display panel further comprises a virtual line extending along a column direction and passing through the optical module arrangement region, and the adjacent first pixel circuits having the distance of L1 and the adjacent first pixel circuits having the distance of L2 are located on a same side of the virtual line.

* * * * *